(12) United States Patent
Gude

(10) Patent No.: US 7,196,651 B2
(45) Date of Patent: Mar. 27, 2007

(54) ANALOG-TO-DIGITAL CONVERTER (ADC)

(75) Inventor: Michael Gude, Buchenhoehe 1, Kerpen, NRW (DE) D-50169

(73) Assignee: Michael Gude, Kerpen (DE)

( * ) Notice: Subject to any disclaimer, the term of this patent is extended or adjusted under 35 U.S.C. 154(b) by 39 days.

(21) Appl. No.: 10/937,769

(22) Filed: Sep. 10, 2004

(65) Prior Publication Data
US 2005/0219099 A1   Oct. 6, 2005

(51) Int. Cl.
*H03M 1/60*  (2006.01)

(52) U.S. Cl. ..................... 341/157; 341/155

(58) Field of Classification Search ........... 341/157, 341/166, 155
See application file for complete search history.

(56) References Cited

U.S. PATENT DOCUMENTS

| 5,150,121 A | * | 9/1992 | Newell et al. ............... 341/157 |
| 5,287,107 A | * | 2/1994 | Gampell et al. ............. 341/137 |
| 6,101,376 A | * | 8/2000 | Bell ............................ 455/218 |
| 2002/0060638 A1 | * | 5/2002 | Nishii et al. ................ 341/157 |

* cited by examiner

*Primary Examiner*—Rexford Barnie
*Assistant Examiner*—Joseph Lauture

(57) ABSTRACT

The present invention shows a high speed ADC which can be implemented easily and with low cost into a pure digital integrated circuit. This is realized by converting the analog input voltage into a pulse signal and measuring the pulse signal in length with the help of a delay line and an edge detector. With an XOR gate the input pulse can be converted into two pulses of different lengths. With a special calculation circuitry the digital output value becomes independent of the reference frequency used.

4 Claims, 3 Drawing Sheets

Analog Frontend

Fig. 1: Analog Frontend
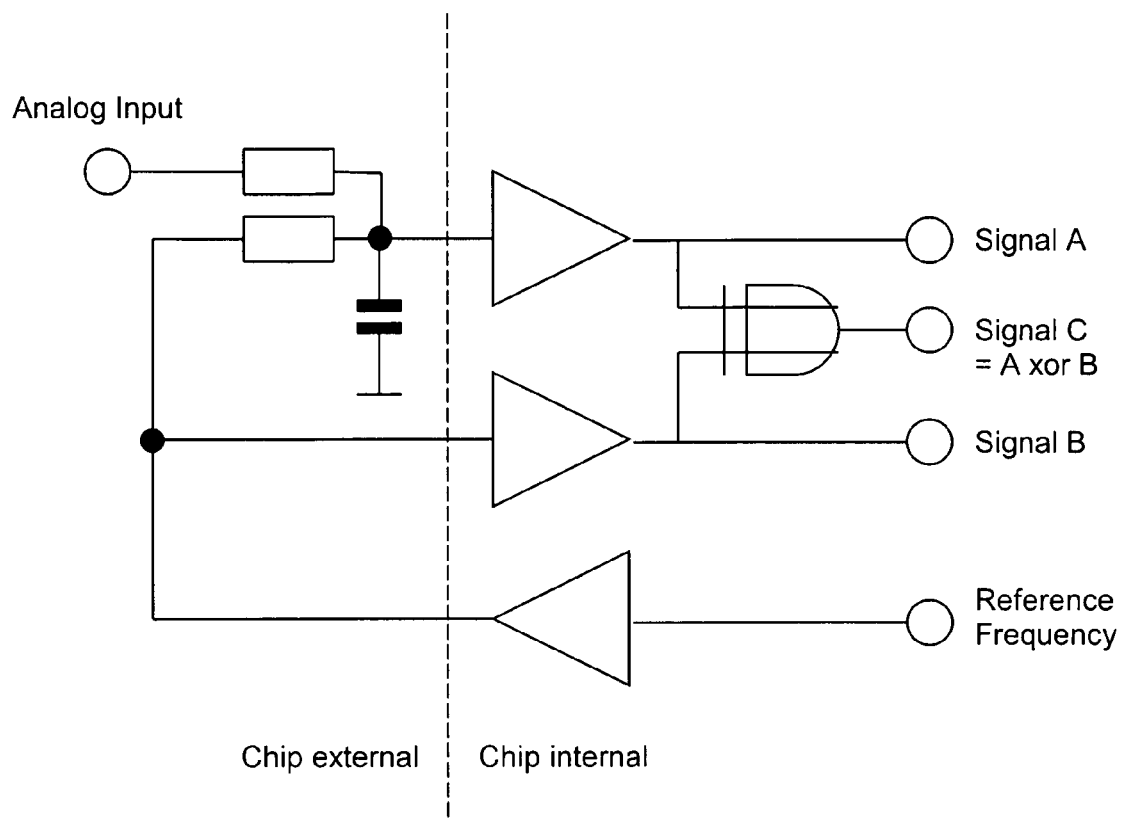

Fig. 2: Timing Diagrams of the Signals A, B und C
Signal B
Signal A without input voltage
Signal A at positive input voltage
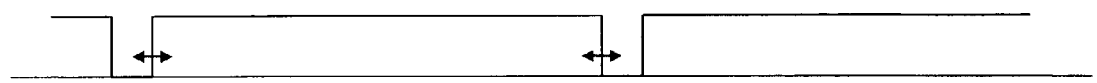
Signal A at negative input voltage
Signal C without input voltage
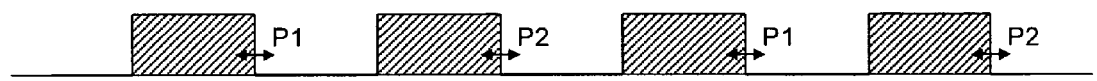
Signal C at positive input voltage
Signal C at negative input voltage

Fig. 3: Measurement of pulse lenght using a delay line
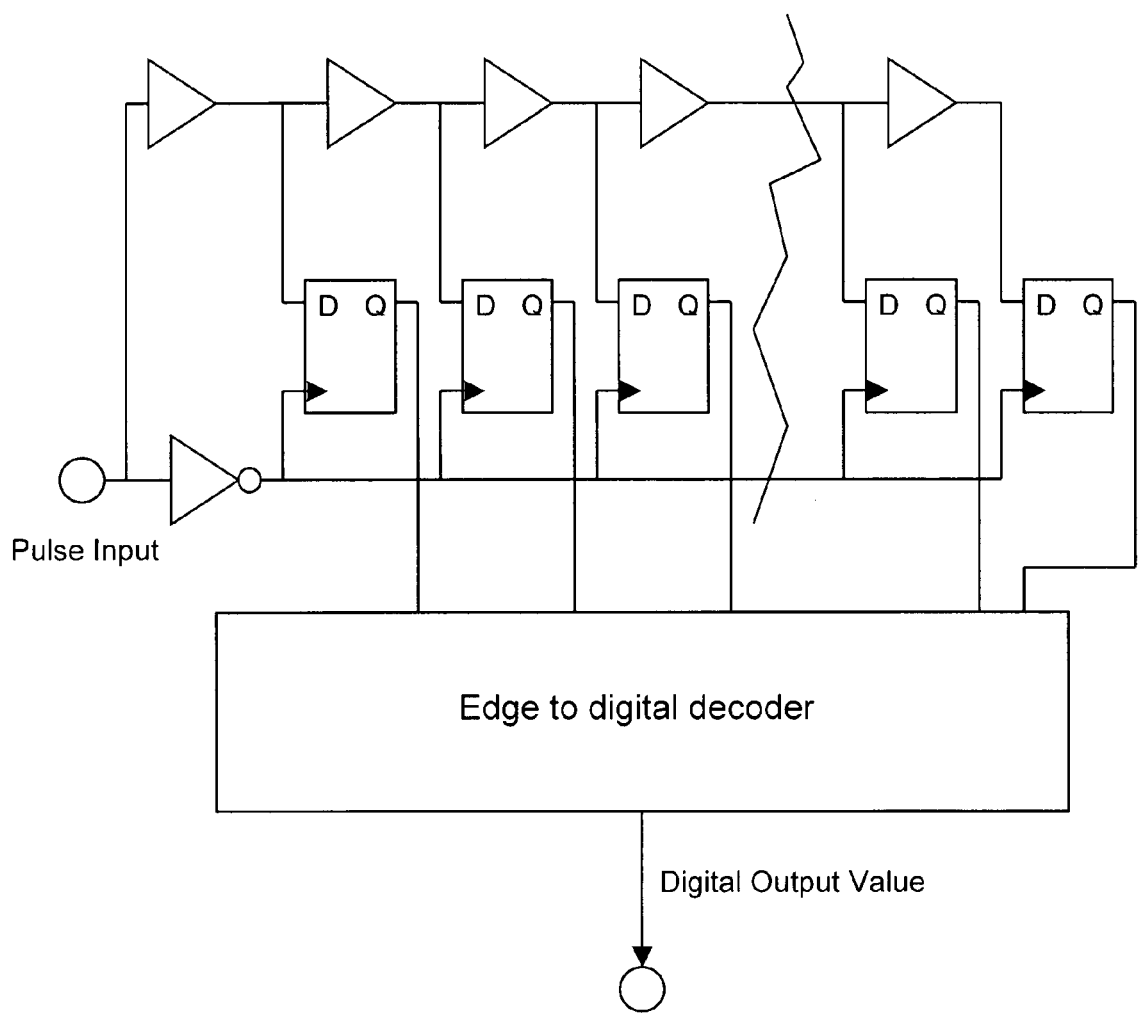

ANALOG-TO-DIGITAL CONVERTER (ADC)

FIELD OF THE INVENTION

This invention is related to an improved Analog to Digital Converter.

BACKGROUND

Analog to Digital Converters (ADC) are well-known circuitries and widely used in many electronic devices. They convert an analog input voltage into a digital output signal as a number of bits. Normally there is a linear correlation between input voltage and digital output value. Important performance data is the resolution normally characterized as number of output bits and the conversion speed of the converter which is measured in samples per second.

An other very important criteria for the practical application is the ability to implement the ADC into an integrated circuit at low cost. On such a chip analog circuitries with high accuracy are not easily implementable at low cost. Furthermore—compared to digital circutries—the nearly automatic shrinking with each new chip generation is not feasible.

Because of this ADCs using the Delta-Sigma principle were widely spread during the recent years. These ADCs normally only use a 1-bit ADC and reach higher resolution by oversampling of the input signal with a following digital filtering. So the analog circuitry is small and furthermore some shortcomings of the analog circuitry are not influencing the quality of the ADC.

Disadvantage of a Delta-Sigma type ADC is the necessary oversampling. This means that the data rate of the converter is far below the sample rate. Because of this fast ADCs with effective data rates of more than 10 Megasamples/s are not feasible as delta-sigma ADCs. Here up to now expensive Flash type converters are used. This kind of ADC suffer from the disadvantage that the effort for the circuitry is increasing exponentially with the number of output bits.

SUMMARY OF THE INVENTION

The present invention shows a high speed ADC which can be implemented easily and with low cost into a pure digital integrated circuit. This is realized by converting the analog input voltage into a pulse signal and measuring the pulse signal in length with the help of a delay line.

BRIEF DESCRIPTION OF THE DRAWINGS

A possible implementation is shown and illustrated with the drawings, of which:

FIG. 1 shows the analog front end of the converter comprising the converter of the input voltage with a voltage divider and the converter of the input pulse into two pulses using an XOR gate. Visible is also what is implemented inside and what is realized outside of the pure digital chip.

FIG. 2 shows timing diagrams for the signals A,B and C from FIG. 1. Pulses P1 and P2 are visible and the influence of the input voltage is shown.

FIG. 3 shows a circuitry comprising a delay line and an edge detector with digital decoder. So the pulse length is converted into a binary value.

DETAILED DESCRIPTION OF THE INVENTION

The present invention shows a high speed ADC which can be implemented easily and with low cost into a pure digital integrated circuit. This is realized by converting an analog input voltage into a pulse signal using a reference frequency and a voltage divider so that the pulse length of said pulse signal is proportional to the analog input voltage (see FIG. 1). The pulse signal is measures in length using a delay line and an edge discriminator so that a digital output signal is generated (see FIG. 3).

The biggest advantage of the invention is shown in FIG. 1. There the implementation using a pure digital chip with a minimized external circuitry is shown. Already behind the input buffers there are only digital signals (see FIG. 2). The measurement of the pulse length can be accomplished by a circuitry shown in FIG. 3. In this circuitry a 1/0 transition (edge) is generated in relation to the length of the input pulse on the delay line of buffers. This edge is saved with a falling transition—the end of the pulse—in a row of flip-flops. Using a decoder the 1/0 transition is detected and converted into a binary signal. This is the output value of the ADC. This value also depends on the reference frequency and also on the absolute delay of the delay line. The delay of the delay line depends on the supply voltage, the temperature and production process tolerance. Using today's semiconductor chip technology measuring resolutions of the delay line of app. 50 ps–200 ps are feasible.

This ADC can be improved by combining said reference frequency and said puls signal by an XOR-gate generating a new pulse signal with two pulses in series with different length (P1, P2). These two pulses have a maximum length which is only half the length of the pulse signal without using the XOR-gate. So the measurement of the pulse length can be done by a delay line having only half the length. This accordingly reduces the number of flip-flops needed.

It is useful to calculate the following ratio from the measured pulse lenghtes P1 and P2:

$$D=K((P1-P2)/(P1+P2))$$

wherein K is a scale factor.

This leads to the following advantages:
a) If P1=P2 the output value is zero.
b) P1+P2 is independent of the analog input voltage a constant value and represents the measured value for the reference frequency. So the value is influenced by the reference frequency and the delay value of the delay line.
c) the factor K should be chosen in such a way that a change of P1 or P2 by one also changes the value of D accordingly.

By this calculation D becomes independent of the frequency value of said reference frequency.

The performance of the ADC can be improved when an input buffer or all input buffers are decoupled from the rest of the circuitry by using a special separated power supply. So noise voltages on the supply lines of the integrated circuit do not negatively influence the measured analog value. This bad effect is mainly due to a modulation of the input threshold voltage of the input buffers. This shortcoming can also be overcome if instead of simple input buffers comparators are used at the inputs and these comparators are feed with a clean compare voltage at the second comparator input.

What is claimed is:

1. An analog-to-digital converter (ADC) wherein an analog input voltage is converted into a pulse signal using a reference frequency and a voltage divider so that the pulse length of said pulse signal is proportional to the analog input voltage and wherein the pulse signal is measured in length using a delay line and an edge discriminator so that a digital output signal is generated.

2. An analog-to-digital converter as in claim 1 wherein an XOR-gate combines said reference frequency and said pulse signal generating a new pulse signal with two pulses in series with different length (P1, P2), wherein the length of these pulses are measured using a delay line.

3. An analog-to-digital converter as in claim 2 wherein the length difference (P1−P2) as well as the length sum (P1+P2) of said two pulses in series are evaluated, wherein the ratio (P1−P2)/(P1+P2) multiplied by a scale factor K is the digital output value, which is independent of the frequency value of said reference frequency.

4. An analog-to-digital converter as in claim 1 wherein an input buffer or all input buffers are decoupled from the rest of the circuitry by using a special separated power supply for them.

* * * * *